United States Patent [19]

Montalto et al.

[11] 4,394,620

[45] Jul. 19, 1983

[54] ELECTRICAL ACCESS TOOL FOR ENGAGING RECESSED TEST POINTS

[75] Inventors: Anthony R. Montalto, Edison; Louis J. Scerbo, Succasunna; Jeremia P. Starace, Randolph Township, Morris County, all of N.J.

[73] Assignee: Bell Telephone Laboratories, Incorporated, Murray Hill, N.J.

[21] Appl. No.: 261,662

[22] Filed: May 7, 1981

Related U.S. Application Data

[62] Division of Ser. No. 78,960, Sep. 26, 1979, Pat. No. 4,298,239.

[51] Int. Cl.$^3$ ............... G01R 1/067; H01R 13/00; H01R 13/516
[52] U.S. Cl. ............................ 324/149; 324/72.5; 324/73 R; 339/108 TP
[58] Field of Search ............... 324/72.5, 149, 158 P, 324/51, 73 PC, 73 R; 339/108 TP, 150 B, 151 B

[56] References Cited

U.S. PATENT DOCUMENTS

| | | | |
|---|---|---|---|
| 2,432,120 | 12/1947 | Neil | 339/75 M |
| 2,449,057 | 9/1948 | Clayden | 339/108 TP |
| 2,928,998 | 3/1960 | Brumfield | 339/186 M |
| 3,275,971 | 9/1966 | King | 339/151 B |
| 3,392,364 | 7/1968 | Glover | 339/108 TP |
| 3,404,340 | 10/1968 | Labrie | 324/72.5 |
| 3,509,297 | 4/1970 | King | 179/96 X |
| 3,575,685 | 4/1971 | Gley | 339/75 M |
| 3,799,168 | 3/1974 | Peters | 339/108 TP |
| 4,092,587 | 5/1978 | Selkow | 324/158 P |
| 4,151,462 | 4/1979 | Teyler | 324/72.5 |

FOREIGN PATENT DOCUMENTS

| | | | |
|---|---|---|---|
| 2537325 | 2/1977 | Fed. Rep. of Germany | 324/72.5 |
| 2221736 | 11/1974 | France | 324/158 P |

*Primary Examiner*—Gerard R. Strecker
*Attorney, Agent, or Firm*—J. T. Peoples

[57] ABSTRACT

Portable test apparatus utilized to access a field of test points comprises either a single access tool (100) or a multiple access adaptor (200) depending on the mode of testing required. Tool (100) is usually employed for accessing the field to effect aperiodic testing whereas adaptor (200) is generally used for planned test activities.

Tool (100) comprises body (111), guide assembly (150) and cover plater (170) which house clamp assembly (130) and pin contact assembly (180). Clamp assembly (130) operates in scissor-like fashion for engaging and disengaging tool (100) from test field grips (401). Spring-loaded pins (181) penetrate apertures (403) within the test field to contact the test points.

Adaptor (200) comprises body (211), center panel (240) and guide (260) which enclose pin contact assembly (280); in addition, cam-lever drive assembly (210) attached to body (211). Drive assembly (210) has means for grasping a frame (50) associated with the test field so as to draw body (211) towards frame (50). In the engaged position, spring-loaded pins (281) contact the test point. Recesses (266) in the front face of guide (260) align juxtaposed test field grips to establish a uniform field of test points.

Multiple slots in the drive assembly provide flexibility for test connector applications such as testing on the panel, outside plant or equipment and on protector families of different heights; however, all units in the panel must be the same height.

4 Claims, 6 Drawing Figures

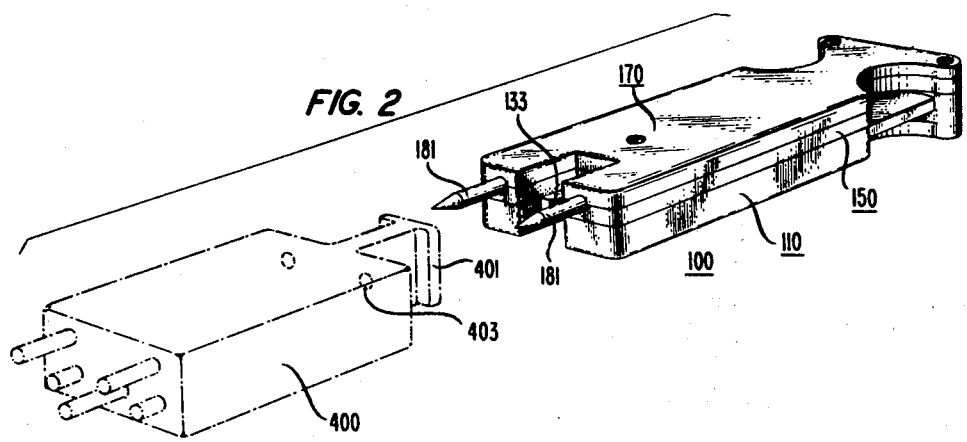
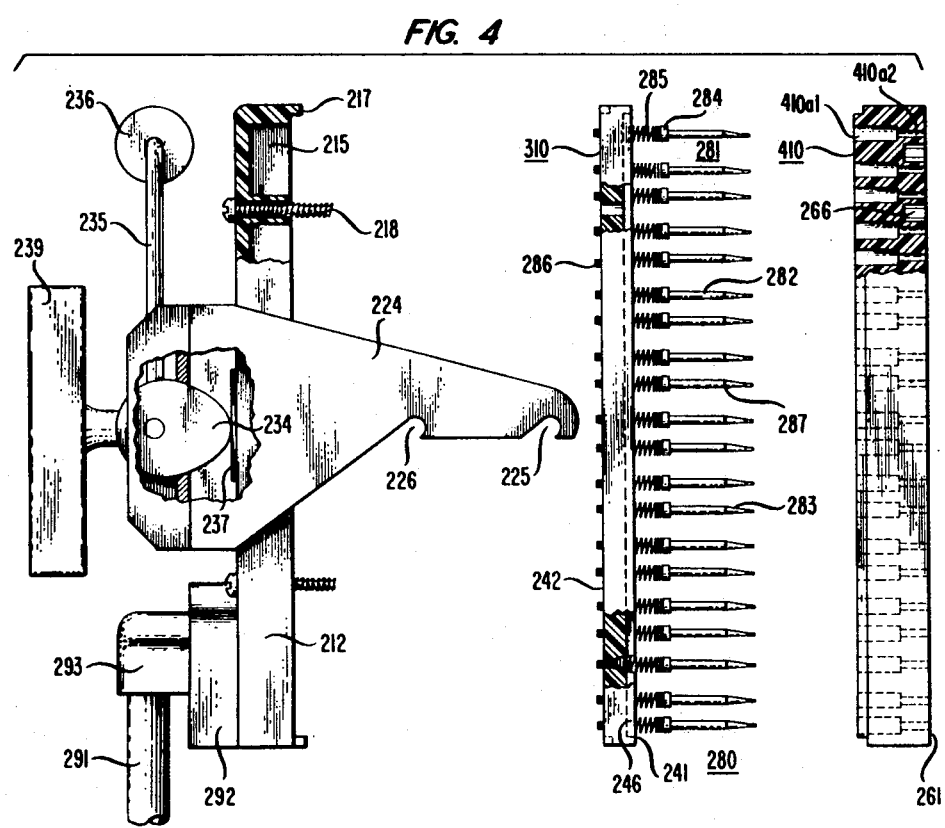

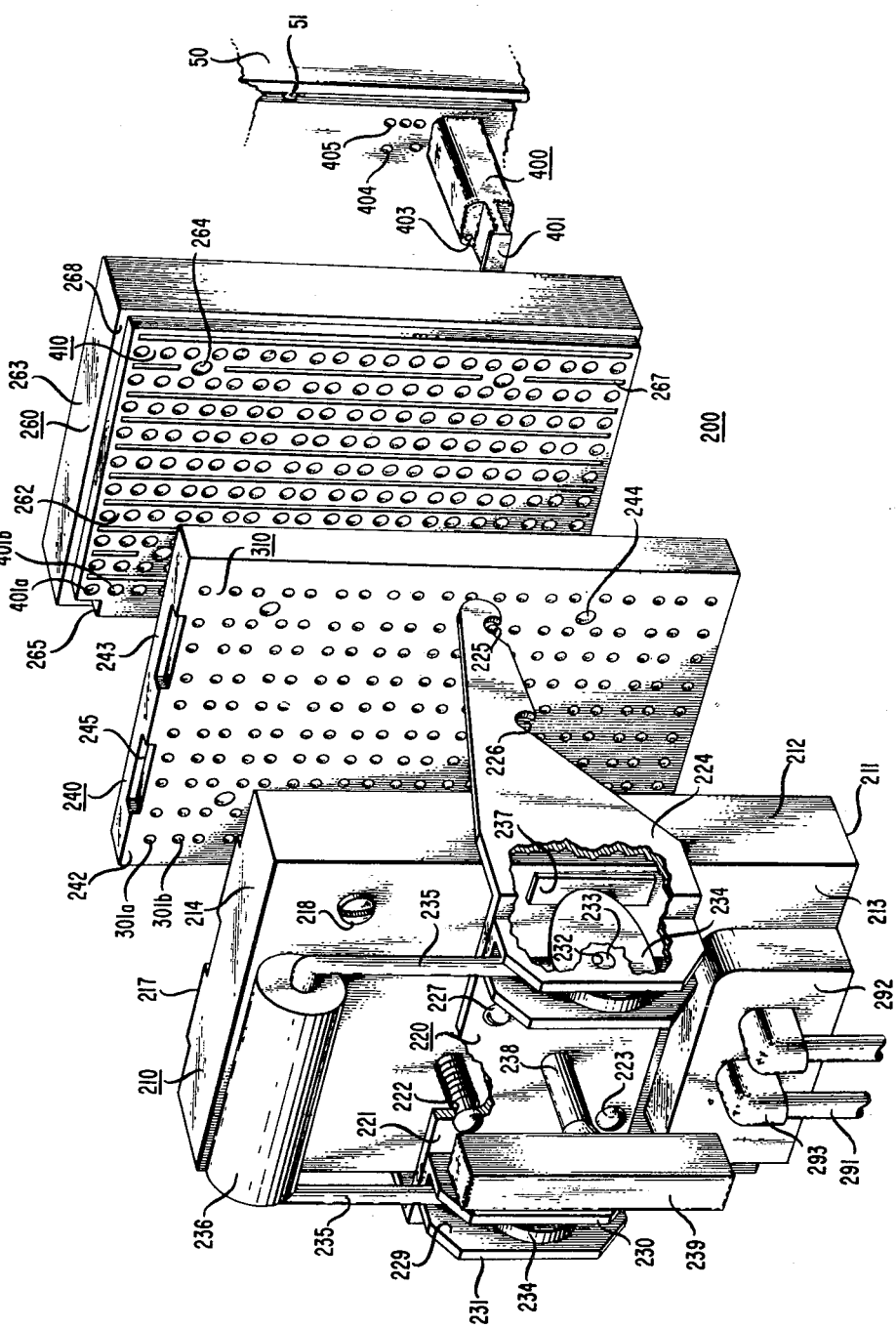

ELECTRICAL ACCESS TOOL FOR ENGAGING RECESSED TEST POINTS

CROSS REFERENCE TO RELATED APPLICATION

This is a division of application Ser. No. 78,960, filed Sept. 26, 1979, now U.S. Pat. No. 4,298,239.

BACKGROUND OF THE INVENTION

1. Field of the Invention

This invention relates generally to electrical connectors and, more particularly, to portable apparatus that is adapted to access a field of test points for electrical testing.

2. Description of the Prior Art

Telecommunication switching systems operate on the basic principle of terminating numerous transmission facilities at a central location and then subsequently interconnecting, when required, selected pairs of facilities through a comprehensive switched network. In a telephone central office, a component of this comprehensive network is the main distribution frame which terminates outside plant facilities and, moreover, furnishes a nonswitched interconnection juncture for joining central office equipment to the outside plant facilities.

The outside facilities homing on the central office are usually subjected to periodic tests, but aperiodic tests may also be required, particularly during troubleshooting activities for fault conditions on the facilities. In either mode, to provide efficient and reliable access for testing, main frame systems oftentimes incorporate fields of test points which are typically bridged electrically to the outside facilities terminated on the main frame. Due to the two different modes of testing, it is desirable to either (1) be able to make connections to a large number of test points at once and to interconnect various types of test equipment, or (2) effect rapid, one-at-a-time connection to a particular test point and interconnect a variety of test instruments.

Numerous methods and devices are known in the prior art for making temporary connections to test points. These devices range: from the rudimentary type wherein a lead is soldered or an alligator-type clip is clamped to a test point; to the most complex type wherein a plurality of grip-like fingers are ganged to operate in unison via camlever means or a spring-loaded pin arrangement mounted with thumb screws is employed to contact many test points at once.

Two references exemplifying test connectors of the latter type are given in U.S. Pat. Nos. 3,275,971 and 3,509,297, both issued to J. H. King on Sept. 27, 1966 and Apr. 28, 1970, respectively. These two test connectors are designed for use on conventional main frame systems that employ spring-like clamps as part of the interconnection arrangement. Conductive fingers provide electrical test access by contacting the appropriate clamps when the test apparatus is in place on the frame. Turndown screws facilitate frame mounting in '297 whereas in '971 the fingers form the primary support for frame mounting.

Presently available prior art frame access devices have been designed for conventional main frame systems. In these systems, besides the interconnection and test fields already described, a third field provides protection provisioning to safeguard personnel and equipment against excessive voltage and current. In a functional sense, the frame system provides for connection, testing and protection; and physically, in conventional frame systems, separate apparatus have served each function.

However, as elaborated upon later, the subject matter of the instant application, as well as three copending applications filed on even date herewith, discloses a new modular main frame system which eliminates the independent appearance of the test field. The conventional, stand-alone test field appearance made inefficient use of available space within the central office and therefore became amenable for modification.

One component of the newly devised system is the protection device. This device, besides providing the required protection against overvoltage and overcurrent conditions, is also adapted to provide the electrical test field. Test lands, internal to the protection device, electrically contact the outside plant pairs and these lands are accessible through apertures in the protector housing. In support of the new frame arrangement, test access apparatus of an unconventional design are now required. Rather than accessing fields serving only a single purpose and best described as lug-type, clamp-like, plug- and jack-type, and so on, the apparatus must access equipment serving multipurposes. The test apparatus must be adapted to conform with the internal layout of the protector device, particularly the positioning of the flat test lands, as well as the physical dimensions and characteristics of the protector, particularly a protruding, finger grip on the housing which facilitiates handling.

SUMMARY OF THE INVENTION

The foregoing requirements are effected with the present invention of main frame test apparatus which access a test field formed from a plurality of juxtaposed devices and which provide electrical interconnection between a plurality of test points accessible through apertures in the devices and a test station having suitable test instruments.

The test apparatus in accordance with the present invention generally comprises: a body having a plurality of channels arranged in mirror-image relation to the apertures in the test field; electrically conductive probe means, arranged in the channels, for penetrating the apertures and contacting the test points; means for centering and holding the body in fixed relation proximate to the test field apertures to insure complete penetration of the probe means; and means for electrically joining the probe means to the test station.

In one illustrative embodiment of the present invention, the apparatus comprises a single access tool that provides one-at-a-time access to a protector device for contacting the flat test lands accessible through apertures in the protector housing. Two spring-loaded electrically conductive pins are mounted in two channels in the body. The movable end of the pin emanates from the body whereas the spring-end is contained within the body. The pins are urged into the apertures to contact the test lands with sufficient pressure to penetrate deleterious nonconductive coatings. The tool grasps the finger grip of the housing with clamps having hooked ends and which are operated in scissor-like fashion for engaging and disengaging the grip.

In a second illustrative embodiment of the present invention, the apparatus comprises a multiple access adaptor which provides a multiplicity of connections to contiguous protector devices. A matrix-like grid of spring-loaded pin pairs mount in a body that includes a front alignment face and a back drive assembly. The pins are positioned in front face channels to penetrate and exert pressure in a manner similar to the single access test tool. Moreover, the front face has a plurality of recesses arranged in mirror-image relation to the field of finger grips so as to align the devices for accessing. The adaptor has means for grasping the main frame and a camlever arrangement coupled to a back drive plate draws the adaptor towards the frame to drive the pins into the test apertures.

The electrical test access apparatus disclosed herein is part of a newly devised modular main frame system which eliminates the independent appearance of the test field by incorporating test access within the protector device and, in addition, facilitates installation and maintenance of the modular components using plug-in and snap-in details. One protector device which combines the protection as well as testing function into a single safety module is the subject matter of U.S. Pat. No. 4,307,430 issued Dec. 22, 1981 to A. R. Montalto, L. J. Scerbo and J. P. Starace. Another protector device serving the protection and testing functions is the subject matter of U.S. patent application Ser. No. 79,064, filed on even date herewith by R. M. Bulley, now abandoned. Central office apparatus which utilizes the protector devices and the instant test access apparatus is the subject matter of U.S. Pat. No. 4,273,966 issued June 16, 1981 to P. R. Briggs, Jr. and L. J. Scerbo.

One feature of the test apparatus implemented in accordance with the present invention is the advantageous use of the projecting finger grip which, normally, merely facilitates manual handling. The single access tool employs the grip as the sole means of maintaining drive force to the spring-loaded pins. The multiple access adaptor uses the juxtaposed arrangement of the grips to establish a uniform field of test points by aligning the grips with the matrix-like grid of recesses in the adaptor's front face. Moreover, as the test adaptor is placed over the protectors, the test pins span the grips and align the individual protectors.

Another feature of the adaptor is its utility in providing a bridging interconnection between not only a test station and the main frame but also between the main frame and a station comprising appearances of other outside plant facilities. Such a situation exists during a cable cut-over wherein both old and new cables must be bridged between their respective main frame appearances prior to the cut-over from old to new facilities. Two adaptors with apparatus for mating the adaptors provide this capability.

Other features and advantages of the present invention will be apparent hereinafter from a detailed description of the invention and the appended claims taken in conjunction with the attached drawing of alternative illustrative embodiments.

BRIEF DESCRIPTION OF THE DRAWING

FIG. 2 is a perspective view of the assembled access tool of FIG. 1 depicting the tool disengaged from the protector device but aligned for impending engagement;

FIG. 3 is an exploded perspective view of an illustrative embodiment of the multiple access adaptor displaying mechanical elements comprising the adaptor;

FIG. 4 is an exploded side view of the access adaptor of FIG. 3 depicting, particularly, the spring-loaded contact pairs;

DETAILED DESCRIPTION

1. Single Access Tool

Figure 1:
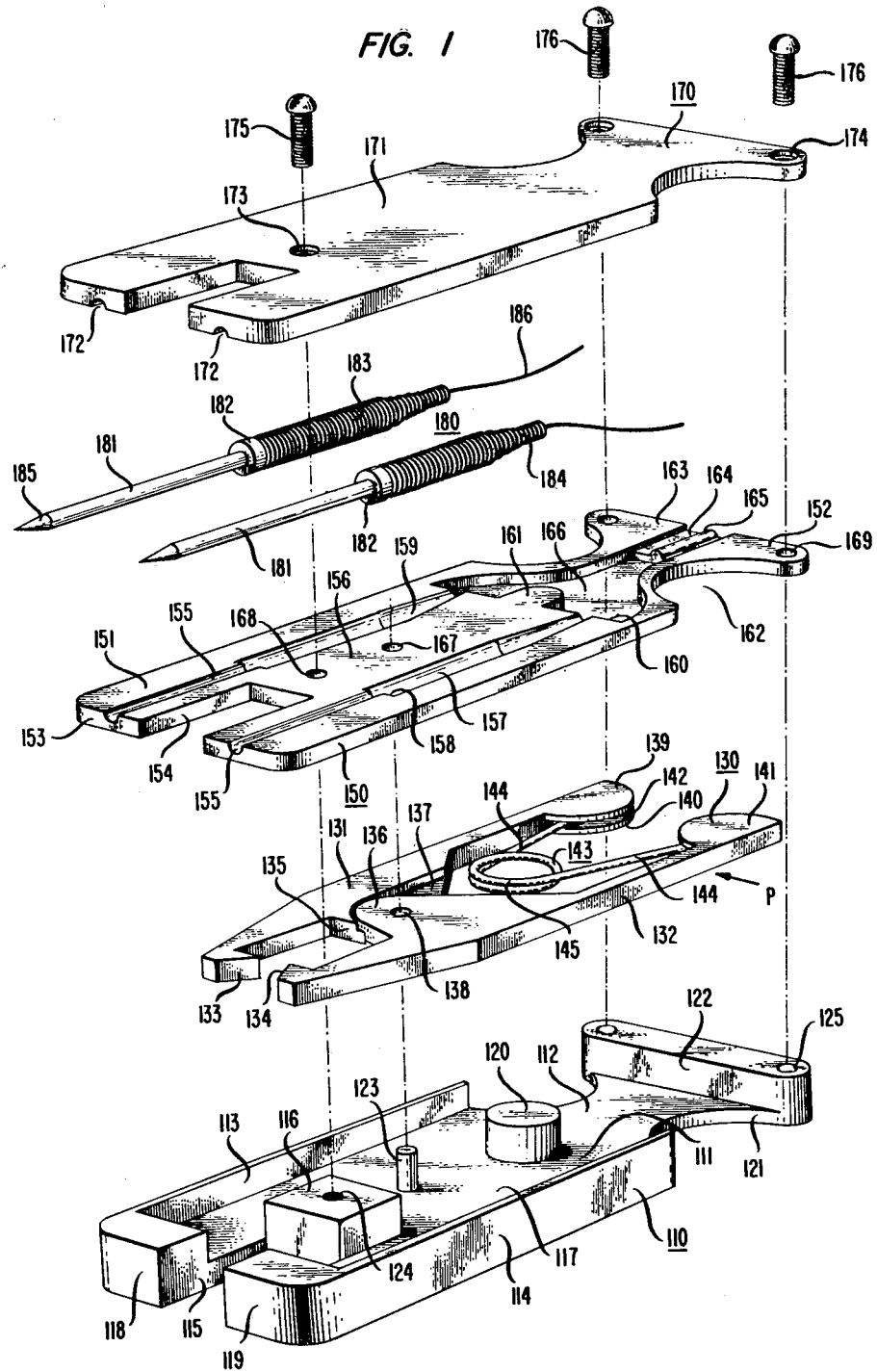
FIG. 1 is an exploded perspective view of an illustrative embodiment of the single access tool displaying the mechanical elements comprising the tool.

The specific example of the one-at-a-time test access apparatus described by way of illustration is shown in exploded perspective view of FIG. 1 and, as assembled, ready for engagement to a protector device, in FIG. 2. With reference to FIG. 1, the overall tool 100 is generally characterized by five component parts, namely: bottom plate 110; clamp assembly 130; guide plate 150; spring contact pins 180; and cover plate 170. The structure as well as operation of tool 100 will be set forth in the description that follows.

The bottom plate 110 includes a thin, rectangularly-shaped body portion 111 and, formed integrally therewith at the back end of body 111, a winged portion 112 of the same thickness. Extending along the longer dimensional sides of body 111 are left and right sides walls 113 and 114, respectively, which project above the top surface of body 111 a distance approximately equal to the body thickness. The planes containing the inner surfaces of walls 113 and 114 are generally transverse to the top surface 117 of body 111. A portion of the front edge of body 111 is recessed to form substantially square-shaped notch 115, which has an opening of about one-third of the width of body 111 and is centered on the front edge. Extending along the front face of body 111, between left side wall 113 and notch 115, is left tip wall 118 which is of the same height as well 113. Similarly shaped right tip wall 119 is formed between notch 115 and right side wall 114. The plane containing the front surfaces of tip walls 118 and 119 is transverse to the planes containing the front surfaces of walls 113 and 114 and the plane of top surface 117. Located on top surface 117 and adjacent the recessed edge of notch 115 is square spacer 116, which rises above surface 117 the same distance as the side walls and the tip walls. Also located on top surface 117 near the rearward portion of body 111 and equidistant from side walls 113 and 114 is circular hub 120. The diameter of hub 120 is approximately the same as the dimension of one side of spacer 116 and the heights of hub 120 and spacer 116 are substantially the same. Winged-shaped portion 112 is formed from two symmetrical, semicircular recesses 121 proximate to the rearward portion of bottom plate 110. The radius of each recess 121 is about 30 percent of the width of body 111. Extending along the back edge of member 112 is back wall 122, which abuts the semicircular recesses 121 near their ends and which is the same height as side walls 113 and 114. The front surface of back wall 122 lies in a plane generally parallel to the plane containing the front faces of tips 118 and 119. It is contemplated that bottom plate 110 may, for example, be formed as a single unit from a high impact, fire retardant, thermoplastic resin through an operation such as injection molding.

The clamp assembly is composed of left clamp 131 and companion right clamp 132 both similarly designed and constructed from substantially the same material, preferably metal. Near the terminal ends of clamps 131 and 132 are respectively inwardly disposed hooks 133 and 134 that cooperate to form means for grasping finger grip 401 (see FIG. 2) so as to engage and hold tool 100 in a fixed relation to protector device 400 (see FIG. 2). Blade 131 has arch-like protuberance 135 projecting inwardly at a point intermediate its length. Similarly shaped protuberance 136 emanates inwardly from clamp 132. The top surface of protuberance 135 is cut away to form landing 137, whereas the underside of protuberance 136 is removed to mate with landing 137 (not visibly apparent in the Figures). Dowel-like rod 123, which is formed integrally as part of body 111, penetrates aperture 138 in protuberance 136 and a correspondingly vertically aligned aperture (not shown) in landing 137 to form a pivot point about which clamps 131 and 132 are rotatable. When protuberances 135 and 136 are superimposed, landing 137 cooperatively meshes with the underside of protuberance 136 so that clamps 131 and 132 are operable in scissor-like fashion.

From the rearward ends of clamp 131, upper and lower left lips 139 and 140, respectively, project inwardly towards clamp 132 and these lips are separated to define gap 142 between them. Similarly shaped and arranged on clamp 132 is an upper right lip 141 and a lower right lip (not apparent in FIG. 1) project towards clamp 131. V-shaped spring 143 has diverging free ends 144 and a coil 145 at the spring vertex. Spring 143 is preferably formed from a unitary piece of resilient material. One spring end 144 slips into gap 142, whereas the other end 144 slips into the gap under lip 141. When assembled, spring 143 is aligned and held in place by coil 145 straddling hub 120 which serves as a pivot point and fixes the position of spring 143. Spring 143 exerts outward forces to the clamp ends proximate lips 139 and 141 to cause hooked ends 133 and 134 to grasp grip 401 (see FIG. 2) when it is inserted in notch 115. The inner surfaces of the clamps proximate hooked ends 133 and 134 straddle spacer 116 whenever pressure P, exerted on the clamp ends to counteract spring force for engaging and disengaging, is removed.

Guide assembly 150 includes a thin, rectangularly-shaped alignment plate 151 and winged-shaped support 152 formed integrally with plate 151 at its back edge. A portion of front edge 153 of plate 151 is recessed to form rectangularly-shaped indent 154, which is vertically aligned and congruent with the opening formed by notch 115 and the space between tip walls 118 and 119. Two laterally disposed, symmetrically located semicircular channels 155 are formed in top surface 156. The distance between the center lines of the channels is substantially the same as the distance between the two apertures 403 to be accessed in housing 401 (see FIG. 2). Each channel 155 extends into plate 151 a distance of about 40 percent of the length of plate 151. Centered on and abutting the rearward end of channel 155 and extending for about 40 percent of the length of plate 151 is laterally disposed semicircular groove 157 formed in top surface 156. The diameter of groove 157 is larger than the diameter of channel 155 so seat 158 is formed at their juncture. Conically-shaped, laterally disposed taper 159, centered on and adjacent the rearward end of each groove 157, extends the remaining approximately 20 percent length of plate 151 and exits at its back edge 160. Semicircular nub 161 protrudes from back edge 160 at about its midpoint. When the tool is assembled, nub 161 rests on the top surface of hub 120 to preclude vertical movement of spring 143.

Winged support 152 is formed from two symmetrical, dome-shaped recesses 162 proximate the rearward portion of guide assembly 150; recesses 162 form finger stops that aid in equalizing pressure P applied to individual clamps 131 and 132. Each dome recess 162 is vertically aligned and congruent with the corresponding semicircular recess 121 in plate 110. A portion of top surface 163 of support 152 is recessed along its back edge to form landing 164. Raised, semicircular guide 165 is disposed in front-to-back relation on landing 164 at its midpoint and provides strain relief for leads 186. Landing 164, domed recesses 162, back edge 160 and nub 161 cooperate to form Y-shaped recess 166 which accommodates internal electrical connection of leads 186 from springs 183 to the external test station (not shown).

The perimetrical shape of guide plate 150, as seen in top elevational view looking towards top surface 156, is congruent to the perimetrical shape of bottom plate 110 as viewed in top elevation towards top surface 117. Similarly, cover plate 170 has the same outline shape as guide plate 150 and bottom plate 110 as viewed in top elevation towards top surface 117. Both guide plate 150 and cover plate 170 are formed from an insulative material similar to that selected for bottom plate 110. As formed, the underside of cover 170 has correspondingly arranged channels 172 which mate with channels 155 as well as grooves and tapers (not shown) which mate with grooves 157 and tapers 159, respectively.

Inserted within the hollow formed by overlayed and abutting channels 155 and 172 are metallic pins 181, each having a pointed end 185 protruding through front face 153. The other end of each pin 181 is affixed to metallic stop 182, which is free to move to and fro within semicircular groove 157 and the companion groove in plate 170. Seat 158 constrains lateral movement of stop 182 on one end of its excursion. Electrically joined to each stop 182 is the front end of coil spring 183, which extends rearwardly so that tapered spring end 184 seats in taper 159 and the associated taper in plate 170. Pins 181 are slidable within channels 155 and 172 so that as pointed ends 185 contact, for example, flat test lands (not shown) within device 400 as tool 100 is urged towards device 400 (see FIG. 2), pins 181 are driven into a retracted position within tool 100. As pins 181 retract, springs 183 exert a force proportional to displacement so that points 185 penetrate any nonconductive coatings on test lands.

A two-wire cord having leads 186, routed across landing 164 so that guide 165 separates each wire, attaches to spring tapers 184. Two separate electrical access paths between the test lands and test instruments (not shown) are provided through leads 186, springs 183, stops 182 and pins 181.

Assembly is completed by juxtaposing the five component assemblies depicted in FIG. 1. When assembled, clamp assembly 130 rests on top surface 117 and is housed within an exterior shell comprising side walls 113 and 114, tip walls 118 and 119 and back wall 122. Thus, clamp assembly 130 lies between the plane containing surface 117 and the plane which contains the top surfaces of: walls 113, 114, 118, 119 and 122; spacer 116; and hub 120. Dowel 123 penetrates aperture 138 in clamp assembly 130 and seats in vertically aligned aperture 167 in alignment plate 150. Screw 175, which penetrates apertures 173 and 168 and seats in threaded aperture 124 in spacer 116, as well as screws 176, which penetrate apertures 174 and 169 and seat in threaded apertures 125, complete the assembled tool 100.

2. Multiple Access Adaptor

The specific example of a multiple access test adaptor described by way of illustration is shown in exploded perspective view in FIG. 3, except for the spring-loaded contact pins which are depicted in the exploded side view of FIG. 4.

With reference particularly in FIG. 3, test adaptor 200, shown in its locked position, is generally characterized by four component parts, namely: drive assembly 210, center panel 240, front guide 260 and contact pin assembly 280 (see FIG. 4). The structure as well as the operation of tool 200 are elucidated in the following description.

The drive assembly 210 comprises insulative, rectangularly-shaped body 211 and cam-lever assembly 220 mounted on body 211. Rightside wall 212, back wall 213, top wall 214, as well as the left and bottom walls (not visibly apparent in the Figures), combine to form recess 215 in the back surface of body 211 (see FIG. 4). The purpose of recess 215 will be described shortly.

Cam-lever assembly 220 includes: rectangularly-shaped main support member 221 disposed in parallel relation to back wall 213 and extending slightly beyond right side wall 212 and similarly on the left side, member 221 being slidably coupled to body 211 with spring-loaded, elongated fasteners 222; and arms 224, formed integrally with support member 221 and oriented in a forwardly directed, perpendicular fashion to member 221 at its ends. Arms 224 have spaced-apart hooks 225 and 226 formed on the underside of each arm. Either hook 225 or 226 couples to a correspondingly aligned lug 51 mounted on the main distribution frame vertical support 50. Lug 51 provides a fixed grip means for drawing test adaptor 200 into firm contact with the test point field. The frontmost hook 225 is utilized for accessing frame apparatus having protector devices 400 inserted therein, whereas the rearmost hook 226 is used to directly access the sockets 404 employed to seat protection devices whenever the protector devices are removed. Each fastener 222 has enlarged head 227 that precludes fastener 222 from slipping through apertures 223 in body 211. However, the diameter of each aperture 223 relative to the elongated portion of each fastener 222 allows for vertical and horizontal movement of members 221 relative to body 211 to facilitate alignment of arms 224 with lugs 51.

Attached to the back wall of member 221 is a pair of identical, symmetrically located, generally U-shaped brackets 229. Right and left bracket side walls 230 and 231 lie in parallel planes that are perpendicular to the plane containing member 221. Each side wall, 230 and 231, has a transverse aperture 232 for accepting rivet-like pins 233. Each pin 233 forms a pivot point about which eccentric cam 234 is rotatable. The driving force to rotate each cam 234 is provided by lever 235 emanating from each cam lobe. Levers 235 are driven in unison with handle 236, which couples to the top portion of each lever 235. As handle 236 is rotated from its bottommost position, cam 234 engages drive plate 237, which is suitably mounted on rear wall 213 of body 211. Continued rotation of handle 236 causes forward displacement of body 211 (as well as panel 240 and guide 260), relative to drive assembly 220 due to increasing cam diameter and forward motion along fasteners 222. When handle 236 is in its uppermost position, maximum separation between body 211 and assembly 220 is achieved. Since arms 224 maintain a fixed relation to the main frame, the cam operation drives body 211 towards the frame and ultimately provides suitable penetration force to contact pin assembly 280.

Hand-grip 239, affixed to member 221 at about its midpoint with the aid of stanchion 238, facilitates manipulation and alignment of tool 200 during its use.

Thin, rectangularly-shaped, insulative center panel 240 has groups of apertures laterally disposed between its front face 241 (see FIG. 4) and back face 242. Each group comprises two vertically aligned apertures. The row of aperture pairs adjacent top edge 243 is designated 301 to 310, the row below this 311 to 320, and so forth. Using group 301 as exemplary, the top aperture has indicia 301a and the other aperture is designated 301b. All apertures are tapered, with the narrow opening of the taper exiting through back face 242.

Insulative front guide 260 is of essentially the same perimetrical shape as panel 240 and it has groups of channels laterally disposed between its front face 261 (see FIG. 4) and back face 262. The channels on back face 262 are arranged and axially aligned in mirror-image relation to the apertures exiting front face 241. Accordingly, the channels in the row nearest edge 263 are designated 401 to 410, the adjacent row 411 to 420, and so forth. Referring particularly to FIG. 4, all channels are bidiametrical. Using channel group 410 as exemplary, with the top channel being designated 410a, the larger diameter channel portion 410a1 penetrates guide 260 to about one-half its thickness. The smaller diameter portion 410a2 penetrates the remaining thickness and exits front face 261. The spacing of the channels in front face 261 is in mirror-image relation to the field of test points to be accessed by tool 200. Elongated, vertically disposed grooves 267 reduce the overall weight of adaptor 200.

Contact pin assembly 280, interposed between panel 240 and guide 260, comprises metallic pins 281, each having a rod-like body 282 with taper 283 on one end and cylindrical seat 284 on the other end. Due to the diameter of each seat 284, it is free to move to and fro in the larger diameter channel portion 410a1, but not in the smaller diameter portion 410a2. Rod 282 is slidable within both channel portions and taper 283 protrudes through front face 261. The driving force for each pin 281 is provided by a spring 285, which is affixed to seat 284 on one end and has taper 286 on the other end. Taper spring end 286 is suitably proportioned to seat in the tapered portion of aperture 310a, with the narrow end of taper 286 protruding slightly from back face 242. Since test adaptor 200 is used to access a test point field comprising either flat test lands or tapered socket openings, pin 281 is adapted for use in either mode by providing lip 287 at the juncture of taper 283 and rod 282. Lip 287, formed by rod 282 having a slightly larger diameter than taper 283 has at its largest diameter, does not allow complete penetration of rod 282 into the socket openings.

Mechanical assembly is completed by juxtaposing the four component assemblies depicted in FIG. 4. With reference to FIG. 3, top and bottom edge notches 217 from assembly 210 fit into correspondingly aligned polarizing grooves 245 of center plate 240. In addition, corner polarizing ledge 265 and perimetrical lip 268 from front guide 260 seat in a complementarily arranged protuberance (not visibly apparent) and recess 246, respectively, in front face 241. Fasteners 218, which penetrate holes 244 in panel 240, seat in threaded apertures 264 in guide 260 to complete the assembled tool.

In the assembled unit, spring taper ends 286 protrude into recess 215. Wiring from cables 291, comprising 100 wire pairs, enter tool 200 through the bottom, rear portion of body 211 via insulative coupler 293 of cover 292 and terminate, one wire per pin, on contact pin assembly 280.

Figure 5:
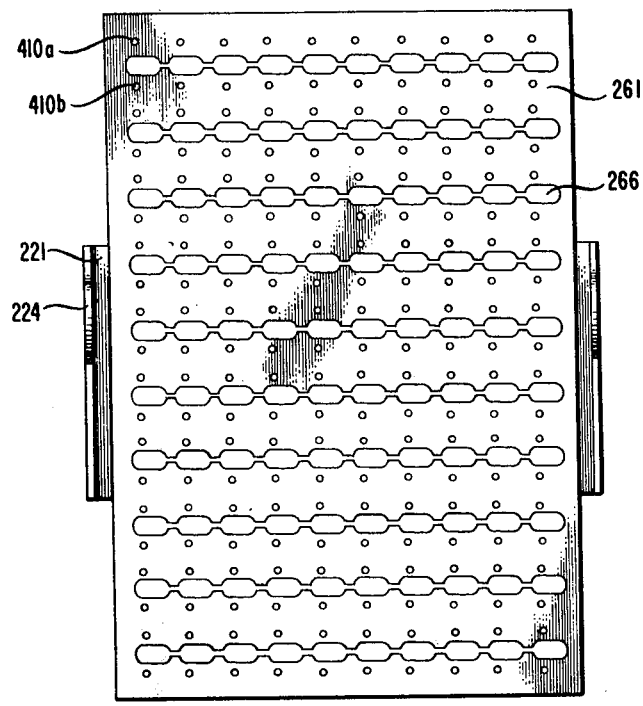
FIG. 5 is a front view of the access adaptor of FIG. 3 showing the recesses for aligning and seating the protector grips.
Figure 6:
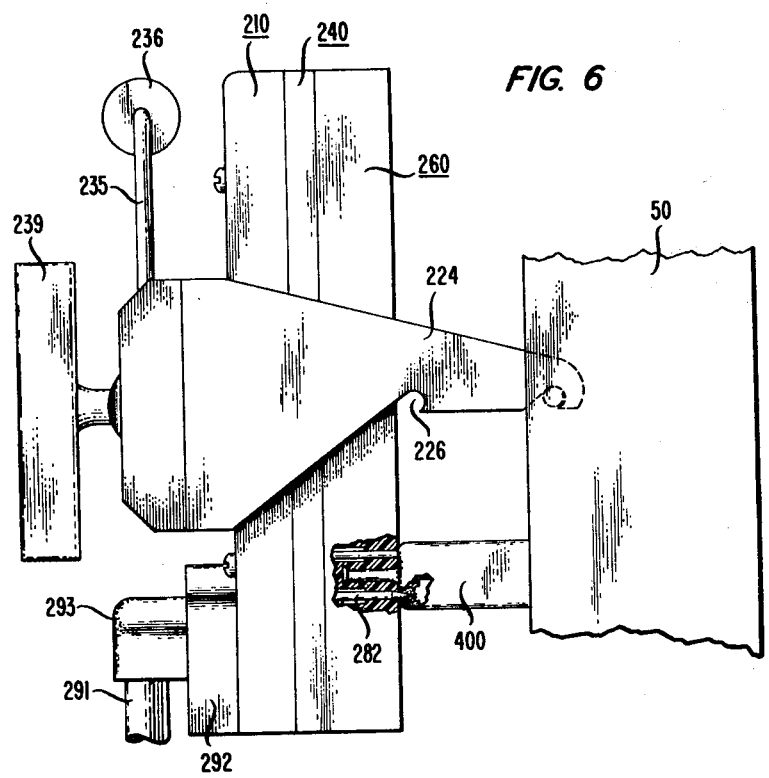
FIG. 6 is a perspective side view of the assembled access adaptor of FIG. 3.

Referring particularly to FIG. 5, which depicts a frontal view of face 261, oval-shaped grip alignment recesses 266 are shown between pairs of channel openings. When test adaptor 200 is manipulated to access a juxtaposed arrangement of protector devices, pairs of pins 281 (see FIG. 4) initiate alignment of each protector device by straddling the individual oval-shaped finger grip on the device. Completed alignment is achieved when the grips are urged by the side walls of recesses 266 into a uniform field as drive assembly 210 is operated to draw adaptor 200 towards the main frame.

Although the foregoing description has focused on the use of adaptor 200 for accessing the outside plant facilities, via either test lands or sockets, adaptor 200 may also be conveniently utilized for accessing central office equipment through sockets 405. With devices 400 removed from frame 50, adaptor 200 merely need be rotated 180 degrees to an inverted orientation; arms 224, via hooks 226, grip lugs 51 and adaptor 200, are operated in a manner essentially the same as that described for the noninverted orientation of FIG. 3. Since pin polarity is also reversed in this mode, suitable equipment, such as an adaptor cord, repolarizes the connection.

It is to be further understood that the test access apparatus described herein is not limited to the specific forms disclosed by way of example of illustration, but may assume other forms, materials or dimensions limited only by the scope of the appended claims.

We claim:

1. A test tool for accessing test points in a field having a protuberance serving to interlock said tool with said field, said tool characterized by
    a layered body comprising a bottom plate, an alignment plate and a cover plate, each said plate formed with correspondingly aligned recesses in their front edges to define a notch in said body, said alignment plate having laterally disposed lower channels formed in its top surface and straddling said notch, said cover plate having upper channels formed in its bottom surface in mirror-image relation to said lower channels,
    electrically conductive spring-loaded pins interposed between said alignment plate and said cover plate and located in cooperatively mating ones of said upper and lower channels, each of said pins having a movable end projecting beyond said body and a spring end fixed in said body, and
    means for holding said body and said test field in juxtaposed relation to enable each said movable end to contact one of said test points, said means for holding interposed between said bottom plate and said alignment plate and including: rotatable first and second fingers, each having a hooked end disposed within said notch and arranged to cooperatively grasp said protuberance; and a spring adapted to exert rotational force proximate the back ends of said fingers to cause each said hooked end to engage said protuberance.

2. The combination as recited in claim 1 wherein said alignment plate includes laterally disposed recesses proximate its back end and said combination further comprises means, located in said recesses, for electrically joining each said fixed spring end to a test station.

3. The combination as recited in claim 1 wherein said means for holding is further characterized in that
    said first and second fingers have inwardly directed first and second tongues, respectively, intermediate their length, said tongues adapted to cooperatively mesh in superimposed relation, each of said tongues having a vertically disposed aperture,
    a dowel for vertically aligning each said aperture for rotation of said fingers about said dowel,
    first and second pairs of lips inwardly directed proximate the back ends of said first and second fingers, respectively, each of said lips forming a gap between them, and
    said spring includes diverging, rearwardly directed spring ends, each of said spring ends interposed in one said gap to provide said rotational force.

4. A test tool for accessing test points in a field having grip means to couple said tool to said test points characterized by
    an insulative, thin, generally rectangular-shaped bottom plate having: a laterally disposed notch formed in the front portion of said bottom plate including the front edge; and a hub projecting from the top surface of said body, adjacent the back edge and proximate the center line of said bottom plate;
    a clamp assembly comprising:
        elongated first and second clamps arranged in juxtaposed relation, said first and second clamps having inwardly directed first and second protuberances, respectively, intermediate their length, said protuberances adapted to cooperatively mesh in superimposed relation, each of said protuberances having a vertically disposed aperture,
        a dowel for vertically aligning each said aperture for rotation of said clamps about said dowel,
        first and second hooks inwardly directed from the front tips of said first and second clamps, respectively, said hooks disposed within said notch and arranged to cooperatively grasp said grip means,
        first and second pairs of lips inwardly directed proximate the back ends of said first and second clamps, respectively, each of said pairs of lips forming a gap between them, and
        a V-shaped spring having a coil at its vertex and diverging, rearwardly directed spring ends, each of said spring ends interposed in one said gap with said coil straddling said hub,
        said spring being adapted to exert rotational force on said back ends to cause said hooks to cooperatively engage said grip means;
    a guide assembly superimposed on said bottom plate, comprising an insulative, thin rectangular-shaped alignment plate having: two laterally disposed lower channels formed in the top surface proximate the frontal portion of said alignment plate; laterally extending lower grooves abutting said channels; laterally projecting lower tapers abutting said grooves and exiting the rear edge of said alignment plate; and an indent formed in said frontal portion and being congruent with said notch;

a pair of spring-loaded contact assemblies, each of said contact assemblies comprising:
- a laterally disposed, conductive pin having a stop on one end and being tapered on the other end,
- a helical spring axially aligned with said pin and electrically joined to said stop on one end and being tapered at the other end;

an insulative, thin cover plate, superimposed on said alignment plate, having a perimetrical shape substantially congruent to the perimetrical shape of said guide assembly and comprising: upper channels, upper grooves and upper tapers formed in the bottom surface of said cover plate in mirror-image relation to said lower channels, grooves and tapers, respectively;

wherein said pin is movable within correspondingly aligned said lower and upper channels and said lower and upper grooves with said tapered pin end projecting from said frontal edge, said coil spring has its tapered end seated in correspondingly aligned said lower and upper tapers, and said stop is constrained by the juncture between each of said channels and grooves; and means for fastening said cover plate to said bottom plate to hold said guide assembly, said clamp assembly and said contact assemblies together.

* * * * *

UNITED STATES PATENT AND TRADEMARK OFFICE
CERTIFICATE OF CORRECTION

PATENT NO. : 4,394,620

DATED : July 19, 1983

INVENTOR(S) : Anthony R. Montalto, Louis J. Scerbo and Jeremia P. Starace

It is certified that error appears in the above-identified patent and that said Letters Patent is hereby corrected as shown below:

Column 4, line 41, "well 113" should read --wall 113--.

Column 7, line 12, "in FIG. 3" should read --to FIG. 3--.

Signed and Sealed this

First Day of November 1983

[SEAL]

Attest:

GERALD J. MOSSINGHOFF

Attesting Officer    Commissioner of Patents and Trademarks